(12) United States Patent
Fujimoto et al.

(10) Patent No.: US 12,210,050 B2
(45) Date of Patent: Jan. 28, 2025

(54) PARTIAL DISCHARGE MEASUREMENT APPARATUS, PARTIAL DISCHARGE MEASUREMENT METHOD, AND PARTIAL DISCHARGE MEASUREMENT SYSTEM

(71) Applicants: KABUSHIKI KAISHA TOSHIBA, Tokyo (JP); Toshiba Energy Systems & Solutions Corporation, Kawasaki (JP)

(72) Inventors: Akira Fujimoto, Yokohama Kanagawa (JP); Takashi Harakawa, Yokohama Kanagawa (JP); Makoto Takanezawa, Yokohama Kanagawa (JP); Hirotaka Tsubakihara, Tokyo (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 160 days.

(21) Appl. No.: 18/173,346

(22) Filed: Feb. 23, 2023

(65) Prior Publication Data

US 2023/0408570 A1 Dec. 21, 2023

(30) Foreign Application Priority Data

Jun. 15, 2022 (JP) .................................. 2022-096852

(51) Int. Cl.
*G01R 31/12* (2020.01)
*G01R 35/00* (2006.01)

(52) U.S. Cl.
CPC ....... *G01R 31/1272* (2013.01); *G01R 35/005* (2013.01)

(58) Field of Classification Search
CPC .......................... G01R 31/1272; G01R 35/005
See application file for complete search history.

(56) References Cited

U.S. PATENT DOCUMENTS

| 6,208,108 B1 * | 3/2001 | Nashiki | H02P 25/08 |
| | | | 318/400.39 |
| 2009/0270053 A1 * | 10/2009 | Bury | H04L 27/364 |
| | | | 455/102 |

(Continued)

FOREIGN PATENT DOCUMENTS

| JP | 6345803 B2 | 6/2018 |
| JP | 2019-211233 A | 12/2019 |

(Continued)

*Primary Examiner* — Jermele M Hollington
*Assistant Examiner* — Zannatul Ferdous
(74) *Attorney, Agent, or Firm* — Foley & Lardner LLP

(57) ABSTRACT

The present embodiment provides a partial discharge measurement apparatus configured to detect partial discharge generated in a rotating electrical machine supplying or receiving power via an insulated conductor, where the apparatus comprises a calibration signal generator, a sensor, a compensation processor, and a signal processor. The calibration signal generator is configured to supply a calibration signal to a surface of an insulating layer of the insulated conductor. The sensor is configured to measure a physical quantity regarding the partial discharge. The compensation processor is configured to use an output signal of the sensor when the calibration signal has been supplied to generate a compensation coefficient. The signal processor is configured to process the output signal of the sensor based on the compensation coefficient.

12 Claims, 15 Drawing Sheets

(56) References Cited

U.S. PATENT DOCUMENTS

2012/0097140 A1* 4/2012 Kusunoki ............... H01T 13/32
                                                                                          123/620
2016/0361819 A1* 12/2016 Wakai ................ A61B 1/00149
2022/0221501 A1    7/2022 Harakawa et al.

FOREIGN PATENT DOCUMENTS

| JP | 2022-107116 A | 7/2022 |
| JP | 2022-124610 A | 8/2022 |
| WO | WO-2017/022032 A1 | 2/2017 |

* cited by examiner

| 10z : GENERATOR INDUCTANCE | *** |
|---|---|
| 11 : ELECTROSTATIC CAPACITANCE OF INSULATING LAYER | 10pF |
| 12 : ELECTROSTATIC CAPACITANCE BETWEEN CONDUCTOR AND SENSOR | 1pF |
| 13 : ELECTROSTATIC CAPACITANCE BETWEEN SENSOR AND SHIELD | 1.5pF |
| 14 : ELECTROSTATIC CAPACITANCE OF COAXIAL CABLE | 1.6pF |
| 15 : INDUCTANCE OF COAXIAL CABLE | 50 Ω |
| 16 : DETECTION IMPEDANCE | 50 Ω |

FIG. 6

| | |
|---|---|
| 10z : GENERATOR INDUCTANCE | *** |
| 11 : ELECTROSTATIC CAPACITANCE OF INSULATING LAYER | 10pF |
| 12 : ELECTROSTATIC CAPACITANCE BETWEEN CONDUCTOR AND SENSOR | 1pF |
| 13 : ELECTROSTATIC CAPACITANCE BETWEEN SENSOR AND SHIELD | 1.5pF |
| 14 : ELECTROSTATIC CAPACITANCE OF COAXIAL CABLE | 1.6pF |
| 15 : INDUCTANCE OF COAXIAL CABLE | 50 Ω |
| 16 : DETECTION IMPEDANCE | 50 Ω |
| 18 : INDUCTANCE OF CONDUCTOR FROM EQUIPOTENTIAL PART TO POSITION IMMEDIATELY ABOVE SENSOR | 5 Ω |

FIG. 9

PARTIAL DISCHARGE MEASUREMENT APPARATUS, PARTIAL DISCHARGE MEASUREMENT METHOD, AND PARTIAL DISCHARGE MEASUREMENT SYSTEM

CROSS-REFERENCE TO RELATED APPLICATIONS

This application is based upon and claims the benefit of priority from the prior Japanese Patent Application No. 2022-096852, filed on Jun. 15, 2022 the entire contents of which are incorporated herein by reference.

FIELD

Embodiments of the present invention relate to a partial discharge measurement apparatus, a partial discharge measurement method, and a partial discharge measurement system.

BACKGROUND

Partial discharge is micro discharge generated inside of an insulating layer when a voltage is applied on a stator coil of a rotating electrical machine. It is thought that, even when such discharge is generated, it does not immediately cause any influence on operation of the rotating electrical machine. However, it is known that partial discharge causes degradation of the insulating material of the insulating layer to progress to a certain extent. Therefore, measurement using a partial discharge measurement apparatus is performed so as not to cause the rotating electrical machine to have dielectric breakdown during its operation as degradation progresses. The reliability of the rotating electrical machine is diagnosed with regular measurement of partial discharge using the partial discharge measurement apparatus.

It is thought that, as the distance from a sensor arrangement position in a partial discharge measurement apparatus to a measurement target area becomes closer, measurement accuracy of the partial discharge measurement apparatus is further improved. However, in a small-scale thermal power generating facility, a hydroelectric generating facility, and the like, since cables serving as conductors connecting a rotating electrical machine to a switchboard located with a certain distance from the rotating electrical machine are applied with insulating treatment or a switchboard and a rotating electrical machine as an existing facility cannot be close to each other, there is a concern that it is difficult to set the sensor arrangement position close to the measurement target area. Further, since the conductors are applied with insulating treatment, it is difficult to directly measure the measurement target area, and there is a concern that measurement values of partial discharge fluctuate according to the insulating layer surrounding the conductors. Furthermore, there is a demand for safer measurement processing.

BRIEF DESCRIPTION OF THE DRAWINGS

FIG. 6 is a diagram illustrating an example of input items and input values regarding each constituent element of an equivalent circuit;

FIG. 9 is a diagram illustrating an example of input items and input values regarding each constituent element of an equivalent circuit;

DETAILED DESCRIPTION

Figure 1:
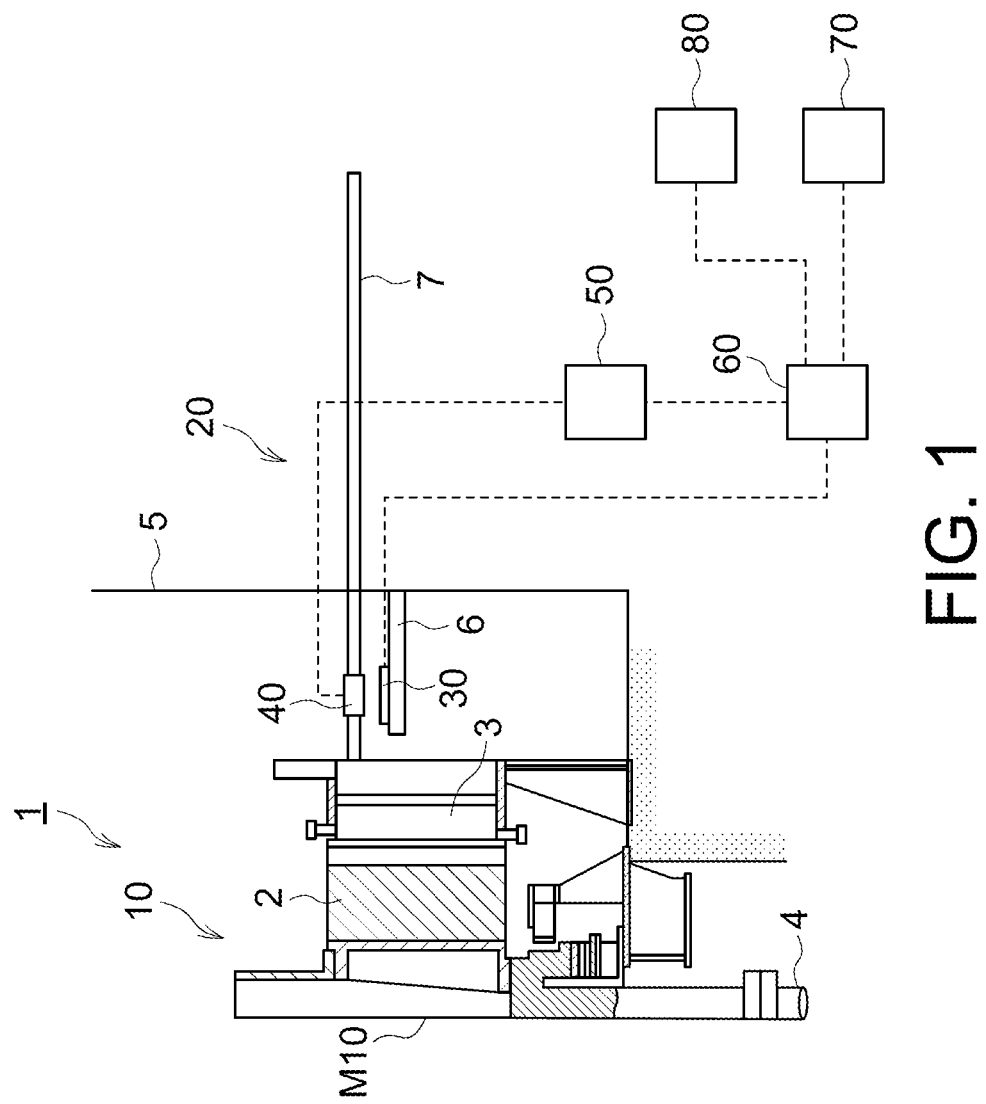
FIG. 1 is a diagram illustrating a schematic configuration example of a partial discharge measurement system according to an embodiment of the present invention.

A partial discharge measurement system, a partial discharge measurement apparatus, and a partial discharge measurement method according to embodiments of the present invention are described below in detail with reference to the accompanying drawings. The embodiments described below are only examples of the embodiments of the present invention and the present invention is not limited to the embodiments. In the drawings referred in the embodiments, same parts or parts having identical functions are denoted by like or similar reference characters and there is a case where redundant explanations thereof are omitted. Further, for convenience of explanation, there are cases where dimensional ratios of the parts in the drawings are different from those of actual products and some part of configurations is omitted from the drawings.

First Embodiment

FIG. 1 is a diagram illustrating a schematic configuration example of a partial discharge measurement system according to the present embodiment. FIG. 1 schematically illustrates a vertical cross-section of a rotating electrical machine 10. As illustrated in FIG. 1, a partial discharge measurement system 1 is a system capable of measuring partial discharge generated in the rotating electrical machine 10 and, for example, includes the rotating electrical machine 10 and a partial discharge measurement apparatus 20.

The rotating electrical machine 10 is a waterwheel generator, for example, and generates electricity by rotating a rotor 2 mechanically connected to a rotation shaft of a waterwheel. The partial discharge measurement apparatus 20 is an apparatus capable of compensating measurement signals and measures partial discharge in the rotating electrical machine 10. That is, the partial discharge measurement apparatus 20 is an apparatus capable of compensating measurement signals at a position away from a measurement target.

As illustrated in FIG. 1, the rotating electrical machine 10 includes, for example, the rotor 2, a stator 3, an insulated conductor 4, a casing 5, and a conductor protection cover 6. The rotor 2 rotates centering on a rotation shaft M10 mechanically connected to a waterwheel. The stator 3 has a predetermined stator coil wound thereon. More specifically, the stator coil is electrically connected to the conductor 4 in a state of being inserted in the stator 3.

The conductor 4 is a conductor cable for three phases (U phase, V phase, and W phase), for example, and is connected to elements such as an inverter or a switchboard. As for the conductor 4, the conductor cable surface is covered with an insulating body and insulated. While an example of a generator is described in the present embodiment, the present invention is not limited thereto. For example, it is also possible to rotate the rotating electrical machine 10 as a motor by supplying power from an alternating-current cable for three phases (U phase, V phase, and W phase). That is, the rotating electrical machine 10 is rotated by receiving power via the insulated conductor 4. Also in this case, the partial discharge measurement apparatus 20 can detect partial discharge in the rotating electrical machine 10.

The casing 5 accommodates therein the rotor 2, the stator 3, and the conductor protection cover 6. The casing 5 may be referred to as "wind tunnel". In the casing 5, the conductor protection cover 6 is arranged vertically below the conductor 4. The conductor protection cover 6 is fixed to the casing 5 and supports a sensor 30.

The conductor protection cover 6 is constituted of a metallic reticular material, for example, and is connected to a predetermined low potential such as a ground potential. With this configuration, it is possible to prevent noise signals from entering the sensor 30. Further, site workers may be in an area around the stator 3 in the casing 5 even during operation. Also in this case, it is possible to prevent site workers from touching a high voltage part in the casing 5. In this manner, as the conductor protection cover 6 is provided vertically below the conductor 4 and the sensor 30 is supported by the conductor protection cover 6, it is possible to prevent noise signals from entering the sensor 30 and also possible to prevent site workers from touching a high voltage part. Further, as described below, when a calibration signal corresponding to partial discharge is generated, even in a case where site workers mistakenly enter inside of the casing 5, it is possible to securely prevent these workers from having an electric shock by a calibration signal. In the present embodiment, a case where the conductor protection cover 6 is provided vertically below the conductor 4 has been exemplified; however, it suffices that the conductor protection cover 6 can prevent site workers from touching the conductor 4 and that the conductor protection cover 6 is provided around the conductor 4. Specifically, when a path for site workers to enter the casing 5 is provided vertically above the conductor 4, the conductor protection cover 6 may be provided vertically above the conductor 4 that is a space between the path and the conductor 4. When a path for site workers to enter the casing 5 is provided on the left side or the right side of the conductor 4, the conductor protection cover 6 may be provided on the left side or the right side of the conductor 4 that is a space between the path and the conductor 4. Further, when the rotating electrical machine 10 is a small-scale rotating electrical machine that is too small for site workers to enter the casing 5, the conductor protection cover 6 may be provided to surround the circumference of the conductor 4 or the conductor protection cover 6 may be provided on the left and right sides of the conductor 4 so as to block any contact to the conductor 4.

In the rotating electrical machine 10, the stator 3 is rotated with rotations of a waterwheel, thereby generating an alternating current on the coil wound around the stator 3. The alternating current is supplied to an inverter or a switchboard via the conductor 4.

The partial discharge measurement apparatus 20 includes the sensor 30, an equipotential part 40, a signal generator 50, a measuring instrument 60, a display 70, and an operating part 80. As described above, the sensor 30 is arranged in the conductor protection cover 6. The sensor 30 is a sensor that measures a physical quantity regarding partial discharge generated in the rotating electrical machine 10 in a noncontact manner, and functions as a partial discharge measurement sensor. For example, the sensor 30 is a sensor that generates a detection signal corresponding to a current flowing into the conductor 4. More specifically, the sensor 30 is a current sensor that is spatially and electrostatic-capacitively coupled with the conductor 4. While the sensor 30 according to the present embodiment is a sensor to be electrostatic-capacitively coupled with the conductor 4, the sensor 30 is not limited thereto. For example, it suffices that the sensor 30 is a sensor that can perform measurement in a noncontact manner with the conductor 4, and the sensor 30 may be a current sensor such as a CT (Current Transformer). Further, while the sensor 30 according to the present embodiment is a current sensor, it is not limited thereto. For example, it suffices that the sensor 30 is a sensor that can measure a physical quantity regarding partial discharge in a noncontact manner with the conductor 4, and may be a voltage measuring sensor.

The equipotential part 40 is made of aluminum, for example, and is an equipotential body that conducts a calibration signal to the surface of an insulating layer of the insulated conductor 4. That is, the equipotential part 40 is arranged on the circumference of the insulating layer of the insulated conductor 4. A face of the equipotential part 40 opposing to the conductor 4 may be a punctuated area or a planar area. Further, the equipotential part 40 does not need to be in complete contact with the circumference of the insulating layer of the insulated conductor 4 and may be formed to be partially in contact with the circumference. In this manner, the equipotential part 40 can be arranged so as to correspond to the outer face of the insulated conductor 4.

The signal generator 50 generates a calibration signal corresponding to partial discharge. The calibration signal is a pulsed signal supplied with a predetermined charge, for example, supplied in a predetermined time unit such as several hundred picocoulombs, and supplied within a several nanosecond range, for example. For example, the calibration signal is set based on a representative value of frequency in partial discharge of a measurement target. With this configuration, the calibration signal is formed to have a frequency corresponding to partial discharge of a measurement target.

The equipotential part 40 and the signal generator 50 are used to acquire data used for signal compensation before actual measurement. Therefore, in the actual measurement, the equipotential part 40 and the signal generator 50 can be removed from the partial discharge measurement system 1. Further, the equipotential part 40 and the signal generator 50 according to the present embodiment constitute a calibration signal generator 50a.

The measurement instrument 60 controls each constituent element of the partial discharge measurement apparatus 20 and measures a physical quantity regarding partial discharge using a detection signal of the sensor 30. The measurement instrument 60 can compensate the detection signal of the sensor 30 using a calibration signal generated by the signal generator 50. Details of the measurement instrument 60 are described later.

The display 70 is a monitor, for example. The display 70 can display, for example, an equivalent circuit diagram of a measuring system, input items on the equivalent circuit diagram, measurement results, and determination results regarding partial discharge.

The operating part 80 is constituted of a keyboard, a mouse, and the like, for example. For example, the operating part 80 sets circuit parameters and the like of a measuring system of the partial discharge measurement apparatus 20.

Figure 2:
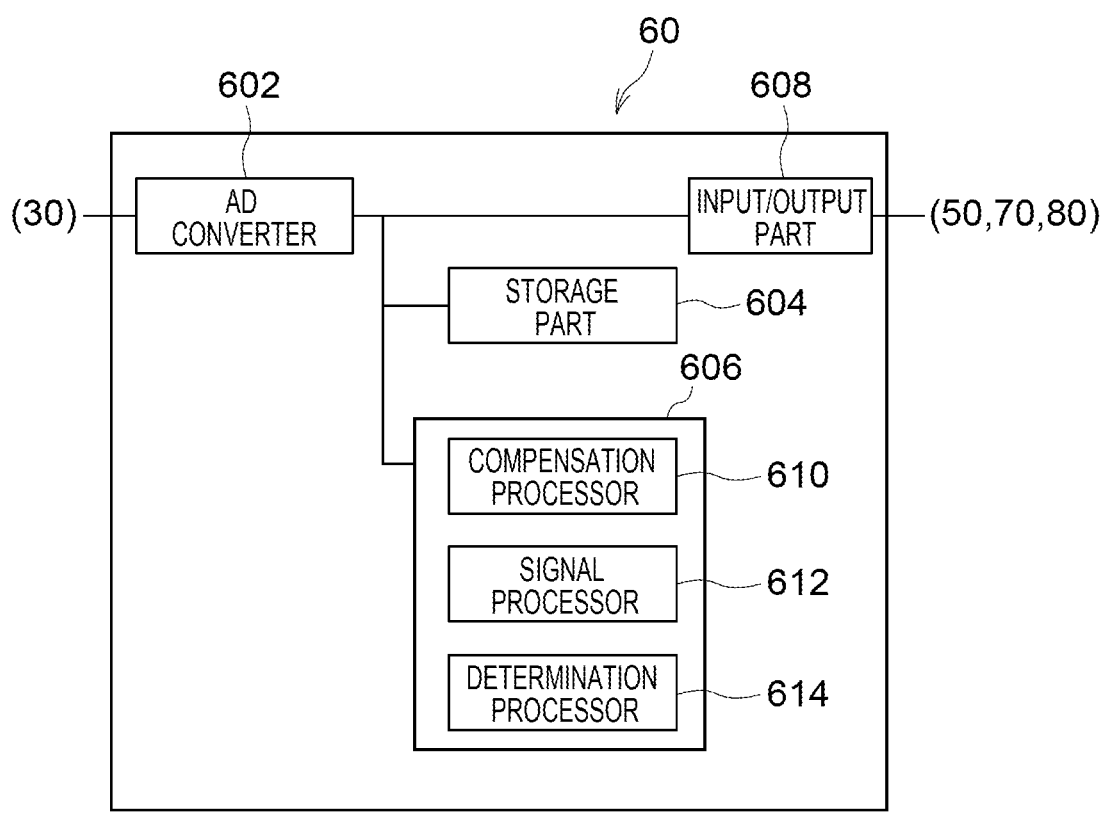
FIG. 2 is a block diagram illustrating a configuration example of a measurement instrument.

FIG. 2 is a block diagram illustrating a configuration example of the measurement instrument 60. The measurement instrument 60 includes an AD converter 602, a storage part 604, a control processor 606, and an input/output part 608.

The AD converter 602 converts a detection signal output from the sensor 30 into a digital output signal. The AD converter 602 may be configured to include an amplifier circuit.

The storage part 604 is realized by, for example, a RAM (Random Access Memory), a semiconductor memory device such as a flash memory, a hard disk, or an optical disk. The storage part 604 stores therein digital output signals generated by the AD converter 602 and the control processor 606. Further, the storage part 604 stores therein programs for the measurement instrument 60 and information required for processing such as equivalent circuit information.

The control processor 606 is configured to include a CPU (Central Processing Unit), for example. The control processor 606 performs control processing according to programs stored in the storage part 604. That is, the control processor 606 constitutes a compensation processor 610, a signal processor 612, and a determination processor 614 according to the programs stored in the storage part 604.

The input/output part 608 functions as an input/output interface. That is, the input/output part 608 can perform input and output of signals between the measurement instrument 60 and the signal generator 50, the display 70, and the operating part 80.

The compensation processor 610 generates a compensation coefficient using an output signal of the sensor 30 when a calibration signal generated by the signal generator 50 has been supplied to the insulated conductor 4. Details of the compensation processor 610 are described later.

The signal processor 612 processes a digital output signal based on the output signal of the sensor 30 based on the compensation coefficient generated by the compensation processor 610 when it is actual measurement. For example, the signal processor 612 multiplies the digital output signal by the compensation coefficient to generate a measurement signal. The measurement signal corresponds to a charge quantity of partial discharge. In other words, the compensation coefficient is generated to be equivalent to the charge quantity of partial discharge. The signal processor 612 may perform a noise reduction process using a lowpass filter and the like. Alternatively, the signal processor 612 may associate a rotation period of the rotating electrical machine 10 with the digital output signal to add the digital output signal in each rotation period.

The signal processor 612 stores measurement signals in the storage part 604. Further, the signal processor 612 can cause the display 70 to display measurement signals on in chronological order via the input/output part 608. With this configuration, an operator can monitor physical quantities regarding partial discharge.

The determination processor 614 determines the state of the rotating electrical machine 10 based on the measurement signal generated by the signal processor 612. For example, when the absolute value of the measurement signal generated by the signal processor 612 exceeds a predetermined threshold, the determination processor 614 determines there is abnormality. Upon determination of abnormality, the determination processor 614 can cause the display 70 to display a display mode indicating occurrence of abnormality via the input/output part 608.

Further, as another example of determination processing, the maximum value of a measurement signal corresponding to pulsed partial discharge generated more than ten times per second is defined as a maximum-discharge charge quantity. The determination processor 614 determines, based on the measurement signal generated by the signal processor 612, there is abnormality when a pulse peak corresponding to partial discharge generated more than ten times per second is obtained and the maximum value of a peak exceeds a predetermined threshold. Upon determination of abnormality, the determination processor 614 can cause the display 70 to display a display mode indicting occurrence of abnormality via the input/output part 608. Further, before performing diagnosis in the determination processor 614, it is also possible that a calibration signal resembling a known discharge signal is input to a first measurement area 9 described later to perform an analytic calibration process by which a relation between the calibration signal and feature amounts such as the peak of the output signal of the sensor 30 is clarified. It is possible to obtain a discharge charge quantity at the time of diagnosis in actual measurement by performing back calculation on the feature amount of an acquired signal based on the analytic calibration process.

Figure 3:
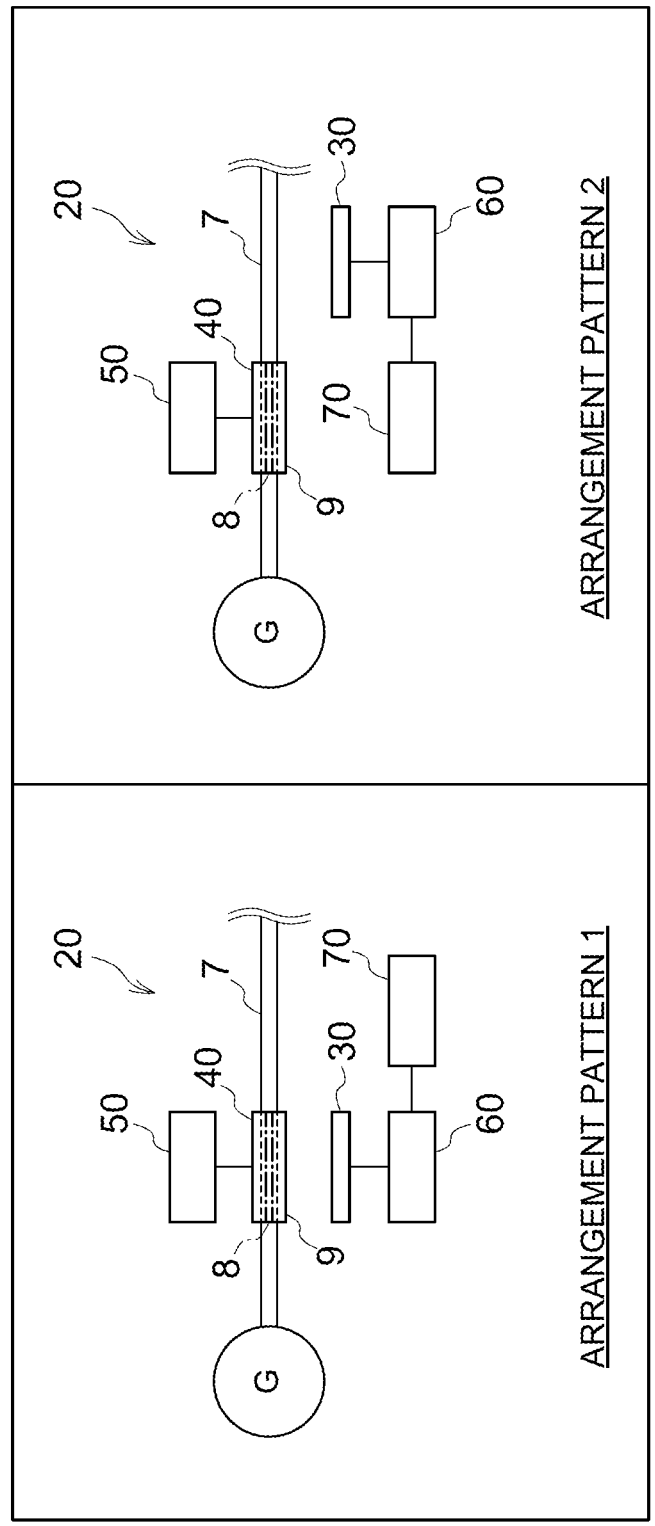
FIG. 3 is a diagram illustrating an arrangement pattern example of a sensor stored in a storage part and an equipotential part.

A detailed process example of the compensation processor 610 is described with reference to FIG. 3 to FIG. 9. FIG. 3 is a diagram illustrating an arrangement pattern example of the sensor 30 stored in the storage part 604 and the equipotential part 40. An arrangement pattern 1 is an arrangement pattern where the sensor 30 is placed immediately below the equipotential part 40. An arrangement pattern 2 is an arrangement pattern where the sensor 30 is not placed immediately below the equipotential part 40. The arrangement pattern of the sensor 30 and the equipotential part 40 corresponds to, for example, two arrangement patterns in this manner.

Figure 5:
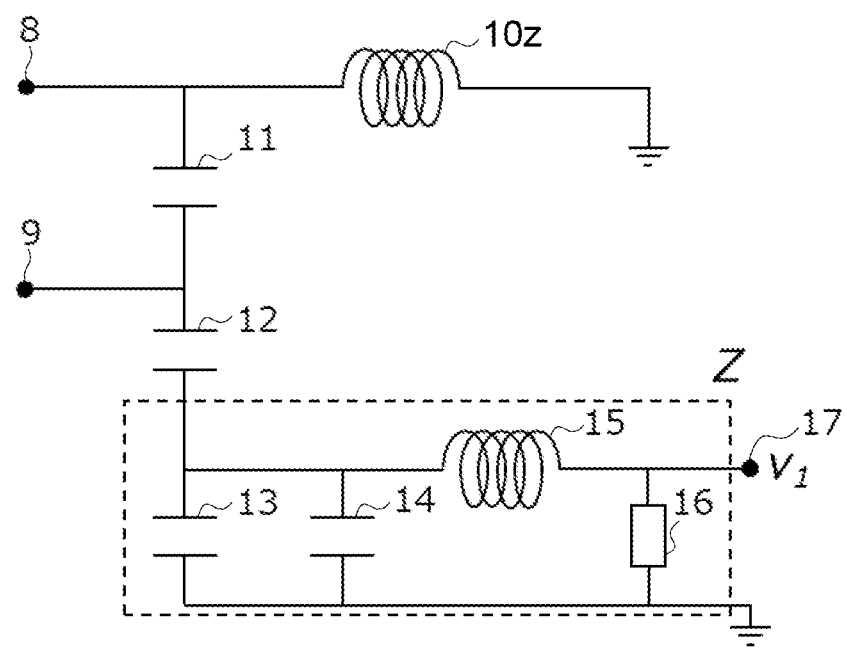
FIG. 5 is a diagram illustrating an equivalent circuit of a measuring system in the arrangement example illustrated in FIG. 4.
Figure 8:
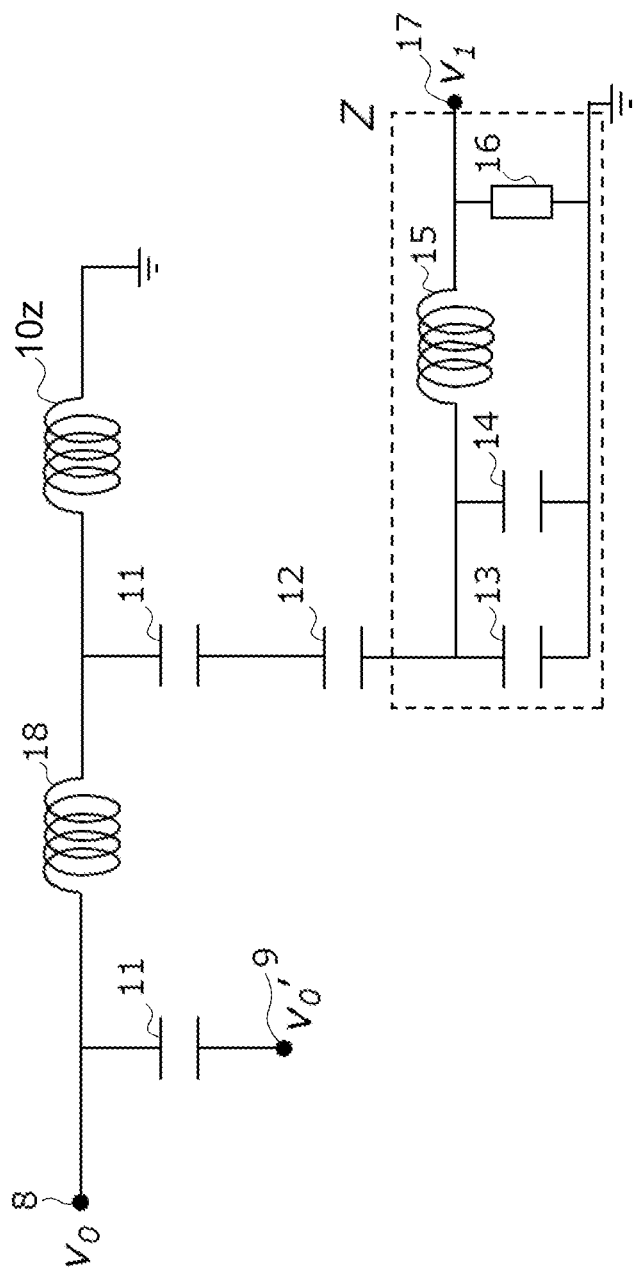
FIG. 8 is a diagram illustrating an equivalent circuit of a measuring system in the arrangement example illustrated in FIG. 7.

As is clear from the above description, an equivalent circuit of the measuring system of the partial discharge measurement apparatus 20 has, for example, two patterns as illustrated in FIGS. 5, 8, and the like described later. The compensation processor 610 causes the display 70 to display a diagram illustrating the arrangement example illustrated in FIG. 3. An operator selects an arrangement pattern with the operating part 80.

Figure 4:
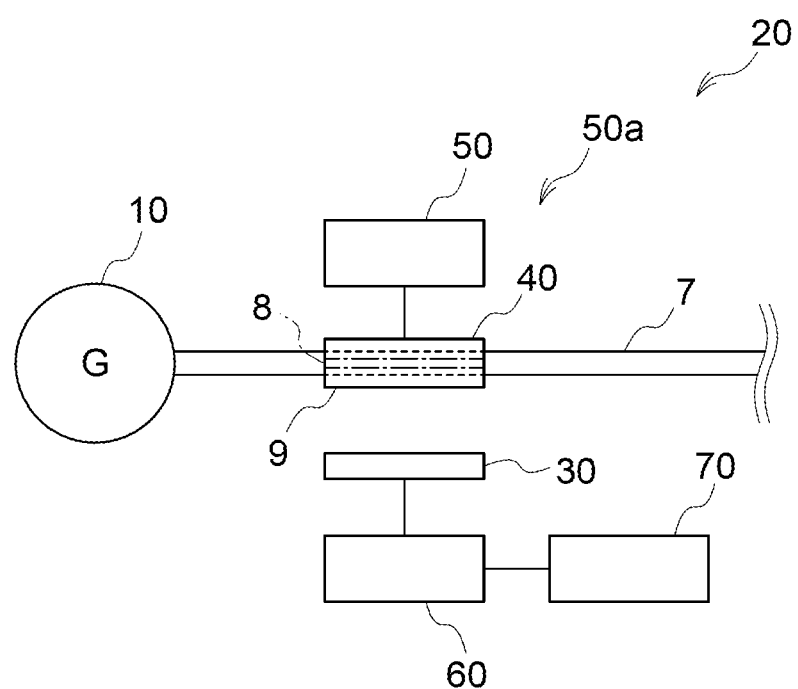
FIG. 4 is a diagram illustrating an arrangement example of an arrangement pattern 1.

FIG. 4 is a diagram illustrating an arrangement example of the arrangement pattern 1. The first measurement area 9 is an area of the equipotential part 40 in which a calibration signal is input. The second measurement area 8 is a virtual area that serves as a measurement target of the sensor 30 when the equipotential part 40 and an insulating body are removed therefrom. That is, the second measurement area 8 is a virtual measuring point directly contacting the conductor 4, and is an area in an insulating layer. The first measurement area 9 is an area on the surface of the insulating layer of the conductor 4 covered with an inner face of the equipotential part 40. The compensation processor 610 uses a measurement signal when a calibration signal has been supplied to the first measurement area 9 to generate a correspondence relation between the measurement signal and a current flowing into the second measurement area 8 as a compensation coefficient. That is, in this measuring system, partial discharge generated in the rotating electrical machine 10 corresponds to a signal measured in the second measurement area 8.

FIG. 5 is a diagram illustrating an equivalent circuit of a measuring system in the arrangement example illustrated in FIG. 4. FIG. 6 is a diagram illustrating an example of input items and input values regarding each constituent element of the equivalent circuit. This equivalent circuit is only an example and the equivalent circuit and examples of numerals are not limited to those illustrated in FIG. 6.

For example, when the arrangement pattern 1 is selected, the compensation processor 610 causes the display 70 to display the equivalent circuit illustrated in FIG. 5 and the input items illustrated in FIG. 6. An operator inputs numerals as configuration values corresponding to the input items illustrated in FIG. 6. These numerals are stored in the storage part 604 once they are set, so that resetting of these numerals is not necessary as long as the measuring system is not changed.

As illustrated in FIG. 4, a generator inductance $10z$ is an inductance in the rotating electrical machine 10, an electrostatic capacitance 11 is an electrostatic capacitance of the insulating layer surrounding the conductor 4, an electrostatic capacitance 12 is an electrostatic capacitance between the conductor 4 and the sensor 30, and an electrostatic capacitance 13 is an electrostatic capacitance between the sensor 30 and a shield. An electrostatic capacitance 14 is an electrostatic capacitance of a coaxial cable constituting the conductor 4, and an inductance 15 is an inductance of the coaxial cable constituting the conductor 4. An impedance 16 is a detection impedance of the sensor 30.

The numerals of these respective elements in the equivalent circuit are known or can be computed using a measurement value. Each element of an impedance Z as well as the electrostatic capacitance 12 are known. Further, for example, the electrostatic capacitance 11 can be calculated by a formula $\varepsilon 0 \varepsilon r \times S/d$, using a virtual distance d between the second measurement area 8 and the sensor 30, a virtual area S of the second measurement area 8, a relative permittivity $\varepsilon r$ of the insulating layer, and a permittivity of vacuum $\varepsilon 0$. In the present embodiment, since the generator inductance $10z$ does not cause any great influence on the impedance of the measuring system, it is ignored in the computation.

A potential V1 on a measuring point 17 is generated when a calibration signal has been supplied from the first measurement area 9 of the equipotential part 40. As described above, since the impedance 16 is a detection impedance of the sensor 30, the potential V1 on the measuring point 17 when a calibration signal has been supplied corresponds to a signal value of a measurement signal of the sensor 30.

As described above, the numerals of respective elements of the equivalent circuit are known. Therefore, for example, an attenuation characteristic v0'/v0, which is a ratio between a generated potential v0 in the second measurement area 8 and an insulating surface potential v0' in the first measurement area 9, is computed as $1/k1=0.909$. At this time, the insulating surface potential v0' in the first measurement area 9 corresponds to, for example, a predetermined charge quantity per several nanoseconds in a predetermined time, such as several hundred picocoulombs. Accordingly, as the potential V1 on the measuring point 17 is multiplied by a coefficient $k1=v0/v0'$ as the reciprocal of an attenuation characteristic, compensation computation corresponding to a predetermined charge quantity can be performed. As illustrated in FIG. 6, for example, when the electrostatic capacitance 11 of the insulating layer of the conductor 4 is 10 pF, the electrostatic capacitance 12 between the conductor 4 and the sensor 30 is 1 pF, the electrostatic capacitance 13 between the sensor 30 and a shield is 1.5 pF, the electrostatic capacitance 14 of a coaxial cable is 2.04 nF, the inductance 15 of the coaxial cable is 5.1 pH, and the detection impedance 16 of the sensor 30 is 50 Ω, $1/k1=0.901$ is established. In this manner, the compensation processor 610 automatically computes the coefficient k1 according to the numerals of the input items illustrated in FIG. 6.

For example, when the electrostatic capacitance 11 of the insulating layer of the conductor 4 is 200 pF, the electrostatic capacitance 12 between the conductor 4 and the sensor 30 is 1 pF, the electrostatic capacitance 13 between the sensor 30 and a shield is 1.5 pF, the electrostatic capacitance 14 of a coaxial cable is 2.04 nF, the inductance 15 of the coaxial cable is 4.97 pH, and the detection impedance 16 of the sensor 30 is 50 Ω, $1/k1=0.995$ is established. In the present embodiment, when an attenuation characteristic value is sufficiently close to 1, since there is only minor influence on calibration precision, compensation processing is omitted. For example, when the absolute value of the attenuation characteristic value is from 0.990 to 1.010, compensation processing is omitted.

In this manner, the compensation processor 610 actually passes a calibration signal to the first measurement area 9 so as to perform measurement with the sensor 30 using an actual measuring system. Further, since the equivalent circuit of the measuring system is known, the compensation processor 610 uses values of respective elements of the equivalent circuit to compute a correspondence relation between a measurement value of the sensor 30 and a measurement value in the second measurement area 8 using a coefficient k1. With this process, the signal processor 612 computes a measurement signal as a current value I8 is set to be $k1 \times V1$. Here, k1 is a compensation coefficient. As is clear from this description, the measurement signal generated by the signal processor 612 corresponds to the current value I8 of the measurement current measured in the second measurement area 8. That is, the measurement signal generated by the signal processor 612 takes a value equivalent to the charge quantity of partial discharge in a predetermined time. In the present embodiment, while a measurement signal is described as "current", the measurement signal is not limited thereto. As described above, it suffices that the measurement signal corresponds to the charge quantity of partial discharge measured in the second measurement area 8 and the measurement signal may be, for example, a voltage signal, or a charge signal per predetermined time.

Figure 7:
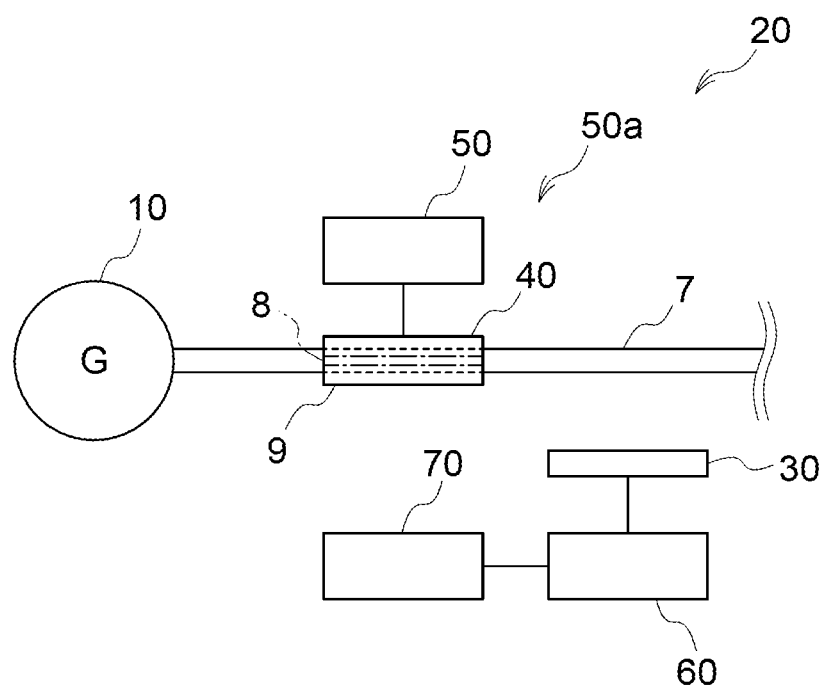
FIG. 7 is a diagram illustrating an arrangement example of an arrangement pattern 2.

FIG. 7 is a diagram illustrating an arrangement example of the arrangement pattern 2. The first measurement area 9 is an area of the equipotential part 40 in which a calibration signal is input. The second measurement area 8 is an area that serves as a measurement target of the sensor 30 when the equipotential part 40 and an insulating body are removed therefrom. That is, the second measurement area 8 and the position of the sensor 30 are separated from each other.

FIG. 8 is a diagram illustrating an equivalent circuit of a measuring system in the arrangement example illustrated in FIG. 7. An inductance 18 of a conductor from the equipotential part 40 to a position immediately above the sensor 30 is added to the arrangement example.

FIG. 9 is a diagram illustrating an example of input items and input values regarding each constituent element of the equivalent circuit. This equivalent circuit is only an example and the equivalent circuit and examples of numerals are not limited to those illustrated in FIG. 9.

As described above, the signal processor 612 uses equivalent circuit information to perform computation as the current value I8 of a measurement current is set to be k1b×V1 based on a relation between a calibration signal and the potential V1. Here, k1b is a compensation coefficient. In this manner, the measurement signal generated by the signal processor 612 is in a relation equivalent to a charge quantity of actually generated partial discharge, and, for example, the physical dimension of the measurement signal matches that of the charge quantity of partial discharge.

As illustrated in FIG. 9, for example, when the electrostatic capacitance 11 of the insulating layer of the conductor 4 is 10 pF, the electrostatic capacitance 12 between the conductor 4 and the sensor 30 is 1 pF, the electrostatic capacitance 13 between the sensor 30 and a shield is 1.5 pF, the electrostatic capacitance 14 of a coaxial cable is 2.04 nF, the inductance 15 of the coaxial cable is 5.1 pH, the detection impedance 16 of the sensor 30 is 50Ω, and the inductance 18 is 5 pH, 1/k1b=1.100 is established.

For example, when the electrostatic capacitance 11 of the insulating layer of the conductor 4 is 200 pF, the electrostatic capacitance 12 between the conductor 4 and the sensor 30 is 1 pF, the electrostatic capacitance 13 between the sensor 30 and a shield is 1.5 pF, the electrostatic capacitance 14 of a coaxial cable is 2.04 nF, the inductance 15 of the coaxial cable is 5.1 pH, the detection impedance 16 of the sensor 30 is 50Ω, and the inductance 18 is 5 pH, 1/k1b=1.001 is established. As described above, for example, when the absolute value of the attenuation characteristic value is from 0.990 to 1.010, compensation processing is omitted.

Figure 10:
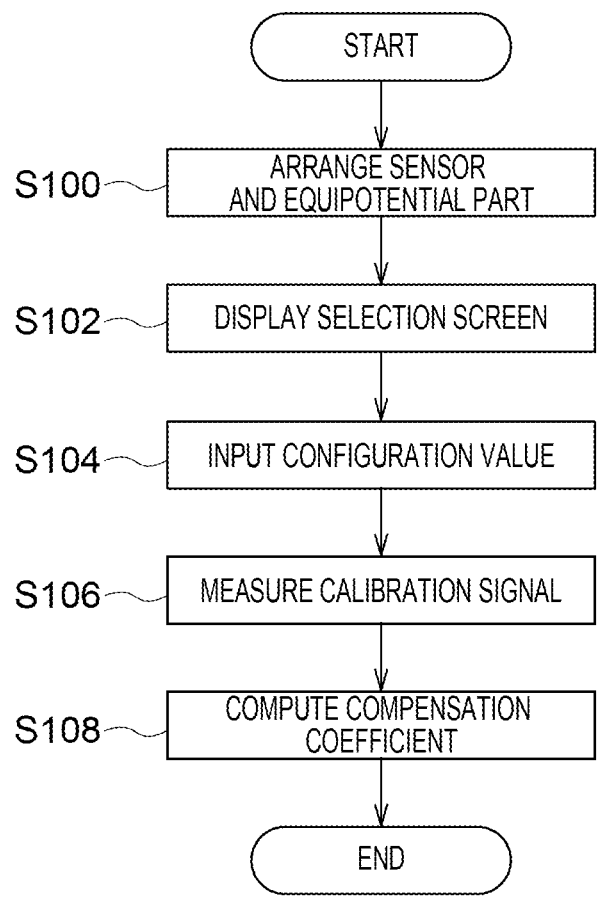
FIG. 10 is a flowchart of an example of compensation processing according to the embodiment.

The configuration of the present embodiment is as described above. A processing example of the present embodiment is described below. FIG. 10 is a flowchart of an example of compensation processing according to the present embodiment. As illustrated in FIG. 10, for example, an operator arranges the sensor 30 in the conductor protection cover 6 (see FIG. 1) and arranges the equipotential part 40 in the casing 5 (Step S100).

Next, the operator selects, for example, the arrangement pattern 1 with the operating part 80 using a selection screen (see FIG. 3) the compensation processor 610 causes the display 70 to display (Step S102). Next, the compensation processor 610 causes the display 70 to display an equivalent circuit of the arrangement pattern 1 and input items (see FIGS. 5 and 6) corresponding to the equivalent circuit, and the operator inputs configuration values corresponding to respective items with the operating part 80 (Step S104). These configuration values are stored in the storage part 604.

Next, the signal generator 50 is caused to generate a calibration signal corresponding to input of a calibration start signal by the operator using the operating part 80, thereby outputting a known calibration signal from the first measurement area 9 of the equipotential part 40. An output signal of the sensor 30 at this time is converted into a digital output signal in the AD converter 602 and the converted signal is supplied to the compensation processor 610 (Step S106).

Figure 11:
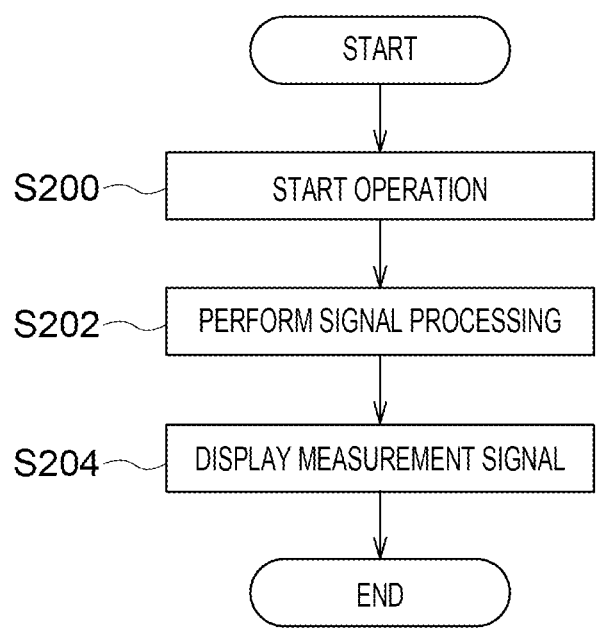
FIG. 11 is a flowchart of actual measurement according to the embodiment.

Next, the compensation processor 610 computes the compensation coefficient k1 based on input items corresponding to the equivalent circuit and the digital output signal (Step S108). In this manner, by actually passing a calibration signal to the first measurement area 9 and performing measurement with the sensor 30 using an actual measuring system, the compensation processor 610 computes, based on a measurement signal V1 of the sensor 30, an actual calibration signal, and each configuration value of the equivalent circuit, a correspondence relation between a current value in the second measurement area 8 and the measurement signal V1 using the compensation coefficient k1. FIG. 11 is a flowchart of actual measurement according to the present embodiment. As illustrated in FIG. 11, an operator starts measurement with the measurement instrument 60 using the operating part 80 (Step S200).

Next, based on the compensation coefficient k1 generated by the compensation processor 610, the signal processor 612 uses a digital output signal based on the output signal of the sensor 30 to generate a measurement signal (Step S202).

Next, the signal processor 612 causes the display 70 to display the generated measurement signal in chronological order via the input/output part 608 (Step S204). In this manner, the signal processor 612 generates a measurement signal based on the compensation coefficient k1 and causes the display 70 to display the generated measurement signal in chronological order. Accordingly, the operator can monitor a measurement signal equivalent to a current measured in the second measurement area 8 inside of the insulating layer of the conductor 4.

As described above, according to the present embodiment, the equipotential part 40 and the signal generator 50 constituting the calibration signal generator 50a supply a calibration signal to the insulated conductor 4, and the compensation processor 610 generates the compensation coefficients k1 and k1b using an output signal of the sensor 30 when the calibration signal has been supplied. Further, the signal processor 612 processes the output signal of the sensor 30 based on the compensation coefficients k1 and k1b at the time of actual measurement. With this configuration, it is possible to proportionate the measurement signal generated by the signal processor 612 and a charge quantity of partial discharge. Furthermore, since the compensation processor 610 generates the compensation coefficients k1 and k1b using equivalent circuit information based on the position of the sensor 30 and the position of the equipotential part 40 regarding the insulated conductor 4, the signal processor 612 can generate a measurement signal equivalent to a current corresponding to partial discharge measured in the second measurement area 8 inside of the insulating layer of the conductor 4.

(Modification of First Embodiment)

The partial discharge measurement system 1 according to a modification of the first embodiment is different from the partial discharge measurement system 1 according to the first embodiment in that a calibration signal is supplied to the conductor 4 in a noncontact manner with the conductor 4 using an antenna 40a instead of using the equipotential part 40. Differences from the partial discharge measurement system 1 according to the first embodiment are described below.

Figure 12:
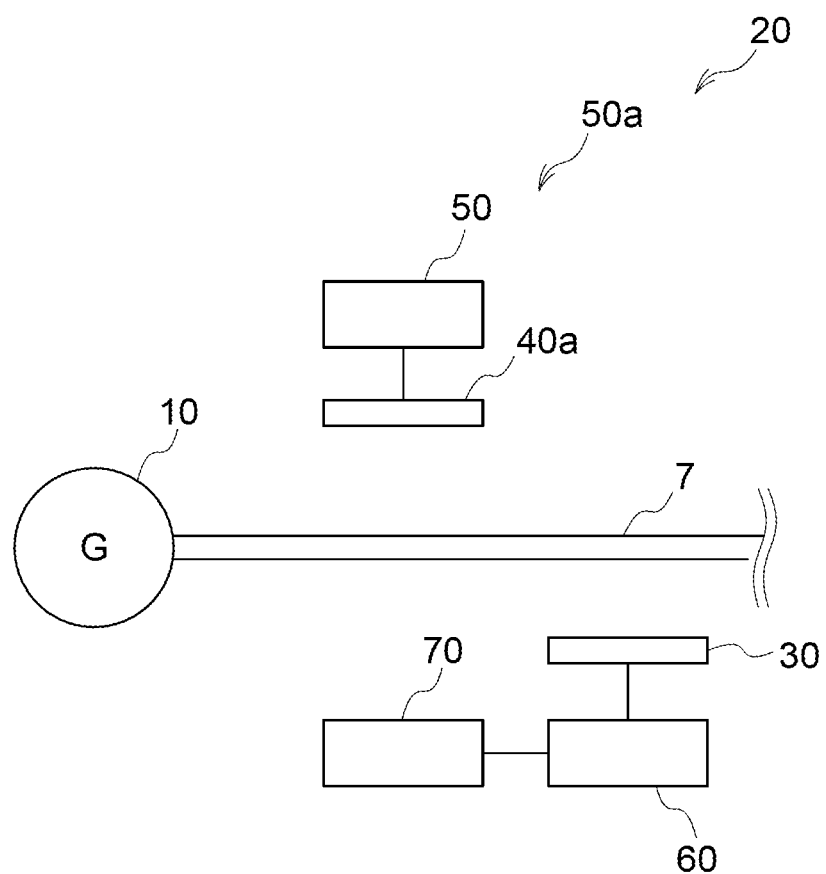
FIG. 12 is a diagram illustrating an arrangement pattern example of the sensor and an antenna regarding a conductor.
Figure 13:
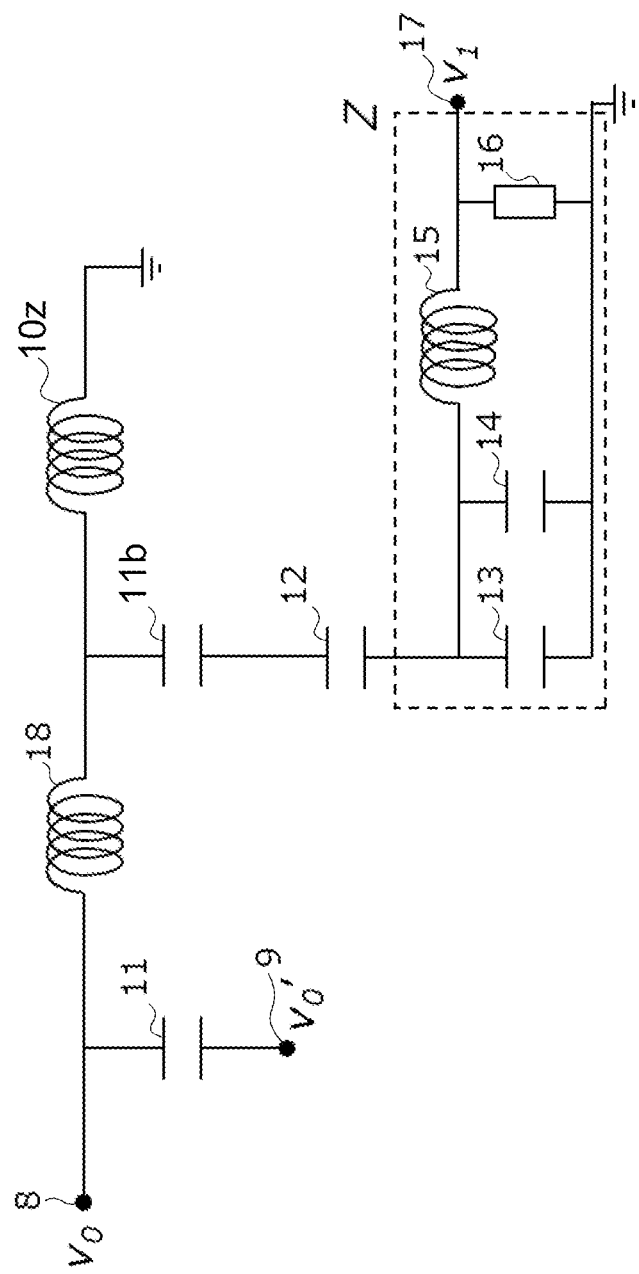
FIG. 13 is a diagram illustrating an equivalent circuit of a measuring system illustrated in FIG. 12.

FIG. 12 is a diagram illustrating an arrangement pattern example of the sensor 30 and the antenna 40a regarding the conductor 4. FIG. 13 is a diagram illustrating an equivalent circuit of the measuring system illustrated in FIG. 12. As illustrated in FIG. 12, a calibration signal is supplied to the conductor 4 in a noncontact manner with the conductor 4 using the antenna 40a. In this case, it is possible to reduce the influence of contact resistance to the conductor 4 so as to compute each compensation coefficient more stably. As illustrated in FIG. 13, the compensation processor 610 can compute each compensation coefficient using an electrostatic capacitance regarding the antenna 40a as the electrostatic capacitance 11b. The antenna 40a and the signal generator 50 according to the present modification constitute the calibration signal generator 50a.

Second Embodiment

The partial discharge measurement system 1 according to a second embodiment is different from the partial discharge measurement system 1 according to the first embodiment in that the partial discharge measurement system 1 according to the second embodiment is further capable of measuring an attenuation rate depending on the length of the conductor 4. Differences from the partial discharge measurement system 1 according to the first embodiment are described below.

Figure 14:
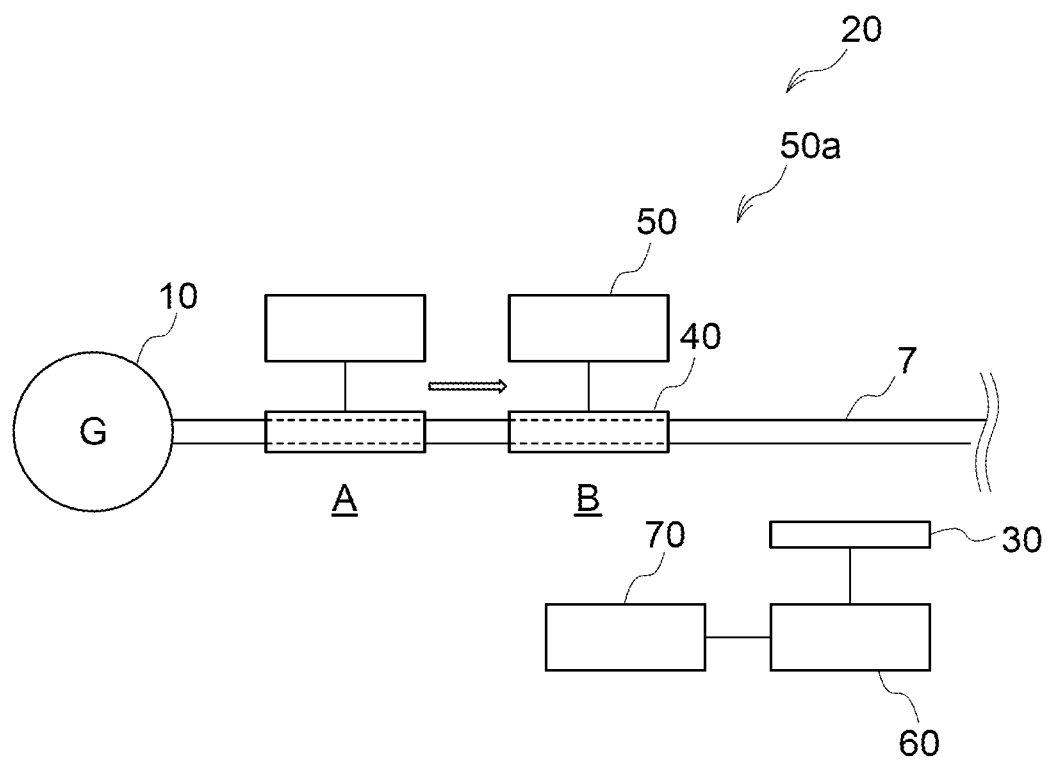
FIG. 14 is a diagram illustrating an arrangement pattern example of the sensor and the equipotential part regarding the conductor.

FIG. 14 is a diagram illustrating an arrangement pattern example of the sensor 30 and the equipotential part 40 regarding the conductor 4. As illustrated in FIG. 14, a calibration signal is supplied to the conductor 4 as the positions of the sensor 30 and the equipotential part 40 regarding the conductor 4 are changed so as to measure a measurement signal.

Figure 15:
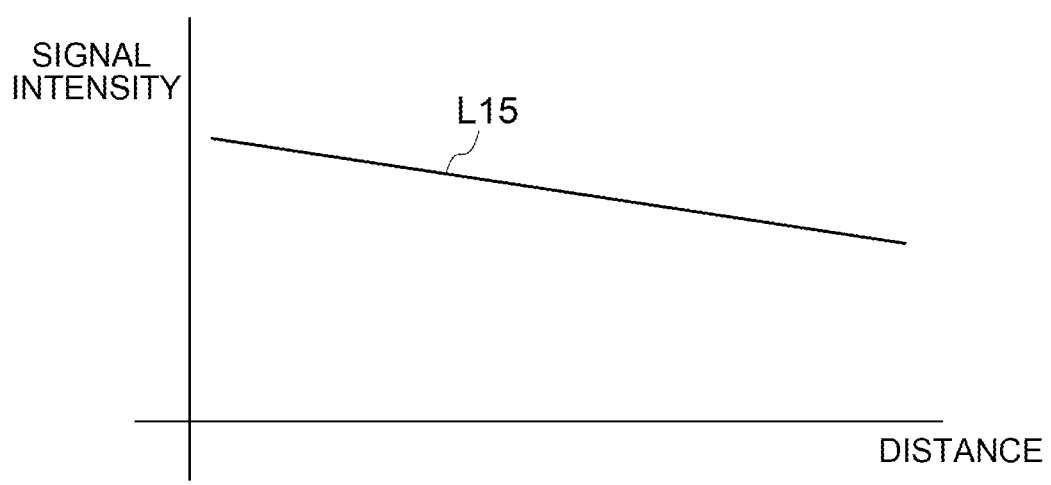
FIG. 15 is a diagram illustrating an example of measurement results.

FIG. 15 is a diagram illustrating an example of measurement results. The horizontal axis represents a distance between the equipotential part 40 and the sensor 30 and the vertical axis represents an intensity of the measurement signal. These pieces of data are stored in the storage part 604.

The compensation processor 610 computes an attenuation rate corresponding to the distance between the equipotential part 40 and the sensor 30, and the computed attenuation rate is reflected on the compensation coefficients k1 and k1b. With this process, it is possible to reflect information on the distance between the equipotential part 40 and the sensor 30 on a measurement signal and measurement accuracy of the partial discharge measurement apparatus 20 is improved.

While certain embodiments of the present invention have been described, these embodiments have been presented by way of example only, and are not intended to limit the scope of the invention. The novel embodiments described herein may be embodied in a variety of other forms, and various omissions, substitutions, and changes may be made without departing from the spirit of the invention. These embodiments and modifications thereof would fall within the scope and spirit of the invention, and would fall within the invention described in the accompanying claims and their equivalents.

The invention claimed is:

1. A partial discharge measurement apparatus configured to detect partial discharge generated in a rotating electrical machine supplying or receiving power via an insulated conductor, the apparatus comprising:
a calibration signal generator configured to supply a calibration signal to a surface of an insulating layer of the insulated conductor;
a sensor configured to measure a physical quantity regarding the partial discharge;
a compensation processor configured to use an output signal of the sensor when the calibration signal has been supplied to generate a compensation coefficient; and
a signal processor configured to process the output signal of the sensor based on the compensation coefficient.

2. The apparatus of claim 1, wherein
the sensor is arranged with a spatial electrostatic capacitance interposed between the insulated conductor, and the calibration signal generator comprises:
a signal generator configured to generate the calibration signal; and
an equipotential part arrangeable to correspond to an outer face of the insulated conductor and configured to supply the calibration signal to the insulated conductor.

3. The apparatus of claim 2, wherein the compensation processor is configured to generate the compensation coefficient using information on an equivalent circuit based on information related to a position of the equipotential part with respect to the insulated conductor, a position of the sensor, and a measurement area inside of the insulating layer of the insulated conductor.

4. The apparatus of claim 3, wherein the signal processor is configured to generate an output signal of the sensor based on the compensation coefficient as a measurement signal corresponding to partial discharge having been measured in the measurement area.

5. The apparatus of claim 4, wherein
the calibration signal generator is configured to supply the calibration signal from the equipotential part at a plurality of positions on the insulated conductor, and
the compensation processor is configured to generate the compensation coefficient using each of output signals of the sensor when the calibration signal has been supplied from the plurality of positions.

6. The apparatus of claim 3, wherein the compensation processor is configured to cause a display to display input items related to constituent elements of the equivalent circuit and to generate the compensation coefficient based on input numerals corresponding to the input items.

7. The apparatus of claim 6, wherein the compensation processor is configured to cause the display to display a plurality of different equivalent circuits and to generate the compensation coefficient according to a selection made by an operator.

8. The apparatus of claim 1, wherein when the compensation coefficient is within a predetermined range, the compensation processor is configured to set a coefficient to be 1.

9. The apparatus of claim 2, wherein
the signal generator is configured to generate an electrical pulse of a current as the calibration signal, and
the compensation processor is configured to generate the compensation coefficient based on an effective value of an output signal of the sensor when the electrical pulse has been supplied.

10. The apparatus of claim 1, wherein
the calibration signal generator comprises:
a signal generator configured to generate the calibration signal; and
an antenna arrangeable on an outer face of the insulated conductor and configured to supply the calibration signal to the insulated conductor in a noncontact manner.

11. A partial discharge measurement method of detecting partial discharge generated in a generator supplying or receiving power via an insulated conductor, the method comprising:
supplying a calibration signal to a surface of an insulating layer of the insulated conductor;
compensation-processing of using an output signal of a sensor arranged in a noncontact manner with the insulated conductor when the calibration signal has been supplied to generate a compensation coefficient; and signal-processing of processing the output signal of the sensor based on the compensation coefficient.

12. A partial discharge measurement system comprising:

a rotating electrical machine including a stator coil and a rotor arranged in a casing;

an insulated conductor connected to the stator coil;

a conductor protection cover arranged in the casing so as to surround at least a part of the insulated conductor;

a sensor arranged on a side of the conductor of the conductor protection cover and configured to measure a physical quantity regarding partial discharge generated in the rotating electrical machine; and a signal processor configured to process an output signal of the sensor(,)

wherein the conductor protection cover in the casing is connected to a predetermined low potential, wherein further comprising a compensation processor configured to use an output signal of the sensor when a calibration signal has been supplied from an equipotential part to a surface of the insulated conductor in the casing and to generate a compensation coefficient, and configured to generate a compensation coefficient using information on an equivalent circuit based on information related to a position of the equipotential part with respect to the insulated conductor, a position of the sensor, and a measurement area inside of an insulating layer of the insulated conductor, wherein the signal processor is configured to generate an output signal of the sensor based on the compensation coefficient as a measurement signal corresponding to partial discharge having been measured in the measurement area.

* * * * *